(12) United States Patent
Yang et al.

(10) Patent No.: US 12,148,619 B2
(45) Date of Patent: Nov. 19, 2024

(54) MANUFACTURING METHOD FOR SEMICONDUCTOR STRUCTURE, AND SEMICONDUCTOR STRUCTURE

(71) Applicant: CHANGXIN MEMORY TECHNOLOGIES, INC., Hefei (CN)

(72) Inventors: Mengmeng Yang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 361 days.

(21) Appl. No.: 17/505,678

(22) Filed: Oct. 20, 2021

(65) Prior Publication Data

US 2022/0223420 A1 Jul. 14, 2022

Related U.S. Application Data

(63) Continuation of application No. PCT/CN2021/103732, filed on Jun. 30, 2021.

(30) Foreign Application Priority Data

Jan. 11, 2021 (CN) .......................... 202110032629.4

(51) Int. Cl.
   *H01L 21/00* (2006.01)
   *H01L 21/225* (2006.01)
   *H01L 27/088* (2006.01)

(52) U.S. Cl.
   CPC ........ *H01L 21/2255* (2013.01); *H01L 27/088* (2013.01)

(58) Field of Classification Search
   CPC .......................... H01L 21/2255; H01L 27/088
   See application file for complete search history.

(56) References Cited

U.S. PATENT DOCUMENTS

| 7,838,908 | B2 | 11/2010 | Kwon |
| 8,017,469 | B2 | 9/2011 | Luo |
| (Continued) | | | |

FOREIGN PATENT DOCUMENTS

| CN | 101814502 A | 8/2010 |
| CN | 102292800 A | 12/2011 |
| (Continued) | | |

OTHER PUBLICATIONS

"Flexible and Robust Capping-metal Gate Integration Technology Enabling Multiple-VT CMOS in MuGFETs", Jun. 2008, Veloso A et al., VLSI Technology, 2008 Symposium ON, IEEE, Piscataway, NJ, USA, pp. 14-15.

(Continued)

*Primary Examiner* — Richard A Booth
(74) *Attorney, Agent, or Firm* — Kilpatrick Townsend & Stockton LLP

(57) ABSTRACT

A manufacturing method for a semiconductor structure includes: a substrate is provided, the substrate including a first region and a second region; a dielectric layer is formed on the substrate; a first diffusion film layer having a first metal oxide layer is formed on the dielectric layer; the first diffusion film layer corresponding to the second region is removed; a second diffusion film layer is formed on the dielectric layer corresponding to the second region, the second diffusion film layer including a second metal oxide layer interfacing with the dielectric layer; and an annealing treatment is performed to diffuse a first metal element in the first metal oxide layer into the dielectric layer corresponding to the first region and diffuse a second metal element in the second metal oxide layer into the dielectric layer corresponding to the second region.

8 Claims, 9 Drawing Sheets

(56) References Cited

U.S. PATENT DOCUMENTS

| | | |
|---|---|---|
| 8,021,939 B2 | 9/2011 | Chudzik |
| 8,232,154 B2 | 7/2012 | Chien |
| 8,232,606 B2 | 7/2012 | Chudzik |
| 8,309,419 B2 | 11/2012 | Schaeffer |
| 8,941,184 B2 | 1/2015 | Ando |
| 8,969,878 B2 | 3/2015 | Kim |
| 9,245,759 B2 | 1/2016 | Schram et al. |
| RE45,955 E | 3/2016 | Luo |
| 2009/0152650 A1 | 6/2009 | Chudzik |
| 2010/0184260 A1 | 7/2010 | Luo |
| 2010/0187610 A1 | 7/2010 | Kwon |
| 2010/0197128 A1 | 8/2010 | Schaeffer |
| 2011/0070702 A1 | 3/2011 | Chien |
| 2011/0215413 A1 | 9/2011 | Ikeno |
| 2011/0227171 A1 | 9/2011 | Chudzik |
| 2013/0154019 A1 | 6/2013 | Ando |
| 2013/0299914 A1 | 11/2013 | Kim |
| 2014/0106556 A1 | 4/2014 | Schram et al. |
| 2015/0102418 A1 | 4/2015 | Kim |
| 2022/0122882 A1* | 4/2022 | Tang ................ H01L 21/76846 |
| 2023/0055307 A1* | 2/2023 | Wu ...................... H01L 23/485 |

FOREIGN PATENT DOCUMENTS

| | | |
|---|---|---|
| CN | 103426928 A | 12/2013 |
| CN | 105448831 A | 3/2016 |
| CN | 105529327 B | 3/2019 |
| CN | 109786448 A | 5/2019 |
| FR | 2952225 B1 | 3/2012 |

OTHER PUBLICATIONS

"Diffusion and Gate Replacement: A New Gate-First High-k/Metal Gate CMOS Integration Scheme Suppressing Gate Height Asymmetry", Jan. 2016, Ritzenthaler Romain et al., IEEE Transactions on Electron Devices, IEEE, USA, vol. 63, No. 1, pp. 265-271.
Supplementary European Search Report in the European application No. 21878741.4, mailed on Dec. 2, 2022, 10 pgs.
International Search Report in the international application No. PCT/CN2021/103732, mailed on Oct. 14, 2021, 5 pgs.
International Search Report in the international application No. PCT/CN2021/103729, mailed on Sep. 27, 2021, 5 pgs.

* cited by examiner

MANUFACTURING METHOD FOR SEMICONDUCTOR STRUCTURE, AND SEMICONDUCTOR STRUCTURE

CROSS-REFERENCE TO RELATED APPLICATIONS

This application is a continuation of International Application No. PCT/CN2021/103732, filed on Jun. 30, 2021, which claims priority to Chinese Patent Application No. 202110032629.4, filed on Jan. 11, 2021. The disclosures of International Application No. PCT/CN2021/103732 and Chinese Patent Application No. 202110032629.4 are hereby incorporated by reference in their entireties.

TECHNICAL FIELD

Embodiments of the disclosure relate to the field of semiconductor manufacturing technologies, and in particular to a manufacturing method for a semiconductor structure, and a semiconductor structure.

BACKGROUND

Semiconductor structures are generally used in electronic devices such as memories and controllers. When a semiconductor structure is applied to a memory, multiple Metal Oxide Semiconductor Field Effect Transistors (MOSFETs) are provided in a peripheral region outside a core region storing data.

In the related art, the MOSFETs generally may include a P-type transistor (PMOS) and an N-type transistor (NMOS) according to different doping types. When a high-k dielectric layer in the MOSFET is manufactured, a dielectric layer is formed on a substrate, and the substrate has a first region and a second region disposed outside the first region; generally, a first titanium nitride layer, an aluminum oxide layer and a second titanium nitride layer are sequentially formed on the dielectric layer, then the first titanium nitride layer, the aluminum oxide layer and the second titanium nitride layer in the first region are removed, and the first titanium nitride layer, the aluminum oxide layer and the second titanium nitride layer in the second region are retained; then, a lanthanum oxide layer and a third titanium nitride layer are formed, and the lanthanum oxide layer and the third titanium nitride layer in the second region are removed; an annealing treatment is performed on the first region and the second region to diffuse an aluminum element into the dielectric layer corresponding to the second region and diffuse a lanthanum element into the dielectric layer corresponding to the first region; and next, a metal gate is formed on the dielectric layer, and then, an N-type transistor is formed in the first region and a P-type transistor is formed in the second region.

However, the first titanium nitride layer, the aluminum oxide layer and the second titanium nitride layer are first formed in the second region, and the first titanium nitride layer disposed between the aluminum oxide layer and the dielectric layer prevents the aluminum element from diffusing into the dielectric layer during annealing, thereby affecting the performance of the semiconductor structure.

SUMMARY

In the first aspect, embodiments of the disclosure provide a manufacturing method for a semiconductor structure, including: a substrate is provided, the substrate including a first region and a second region disposed outside the first region; forming a dielectric layer on the substrate; a first diffusion film layer is formed on the dielectric layer, the first diffusion film layer including a first metal oxide layer; the first diffusion film layer corresponding to the second region is removed; a second diffusion film layer is formed on the dielectric layer corresponding to the second region, the second diffusion film layer including a second metal oxide layer interfacing with the dielectric layer; and an annealing treatment is performed to diffuse a first metal element in the first metal oxide layer into the dielectric layer corresponding to the first region and diffuse a second metal element in the second metal oxide layer into the dielectric layer corresponding to the second region.

In the second aspect, the embodiments of the disclosure provide a semiconductor structure, including: a substrate, the substrate including a first region and a second region disposed outside the first region. The semiconductor structure further includes a dielectric layer provided on the substrate, a first diffusion film layer is provided on the dielectric layer corresponding to the first region, and the first diffusion film layer includes a first metal oxide layer; and a second diffusion film layer is provided on the dielectric layer corresponding to the second region, and the second diffusion film layer includes a second metal oxide layer interfacing with the dielectric layer.

BRIEF DESCRIPTION OF THE DRAWINGS

To describe the technical solutions in embodiments of the disclosure or the prior art more clearly, the accompanying drawings required for describing the embodiments or the prior art are briefly introduced below. Apparently, the accompanying drawings in the following description show merely some embodiments of the disclosure, and persons of ordinary skill in the art can still derive other accompanying drawings from these accompanying drawings without involving an inventive effort.

DESCRIPTION OF REFERENCE NUMERALS

Figure 1:
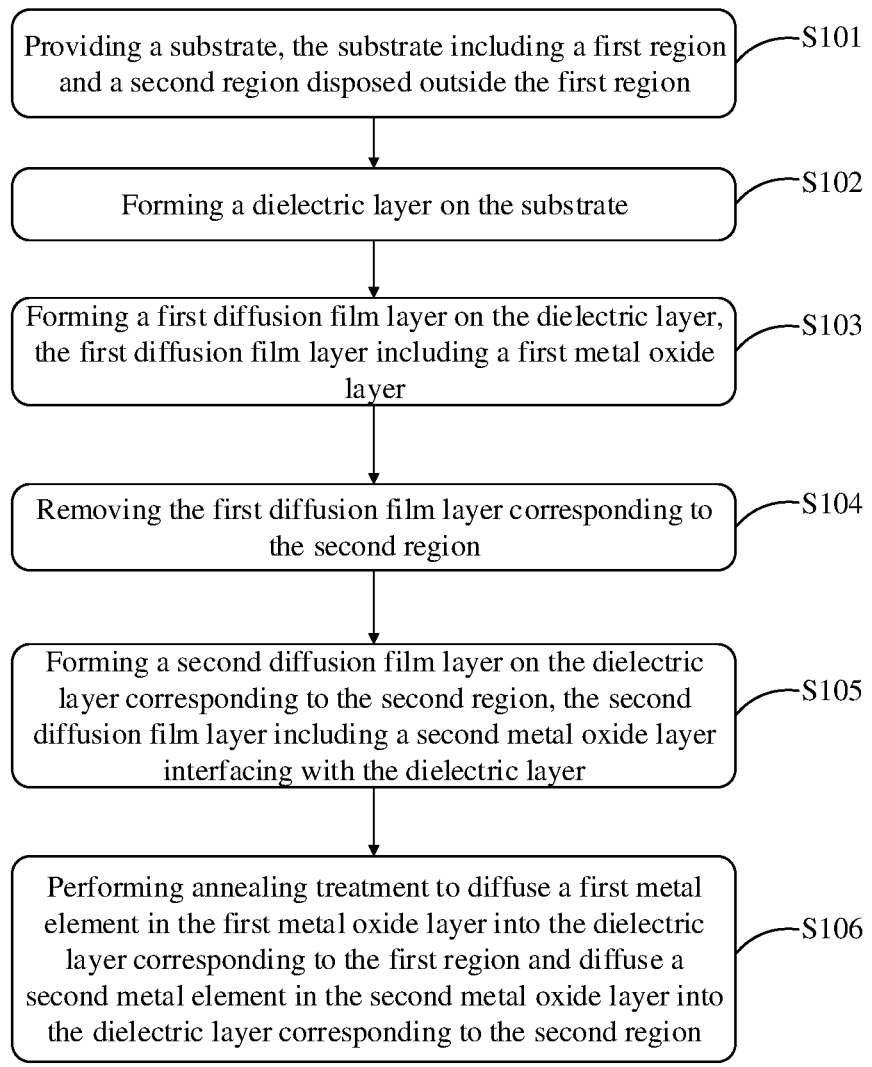
FIG. 1 is a flowchart of a manufacturing method for a semiconductor structure according to an embodiment of the disclosure.

10: substrate;
11: epitaxial layer;
20: dielectric layer;
21: second dielectric layer;
22: first dielectric layer;
30: first diffusion film layer;
31: barrier layer;
32: first metal oxide layer;
33: first sealing layer;
40: second diffusion film layer;
41: second metal oxide layer;
42: second sealing layer;
A: first region;
B: second region.

DETAILED DESCRIPTION

To describe the purpose, the technical solutions and the advantages of embodiments of the disclosure more clearly, the technical solutions in the embodiments of the disclosure are described more clearly and integrally by combining the accompanying drawings in the embodiments of the disclosure. Apparently, the described embodiments are some of the embodiments of the disclosure, but not all the embodiments. Based on the embodiments of the disclosure, all other embodiments obtained by persons of ordinary skill in the art without involving an inventive effort shall fall within the scope of protection of the disclosure.

In the related art, when a semiconductor structure is formed, a dielectric layer and a second diffusion film layer are sequentially formed on a substrate, the second diffusion film layer including a second metal oxide layer; then, the second diffusion film layer corresponding to a first region of the substrate is removed; then, a first diffusion film layer is formed on the dielectric layer corresponding to the first region, the first diffusion film layer including a first metal oxide layer; and next, an annealing treatment is performed, so that a first metal element in the first metal oxide layer is diffused into the dielectric layer of the first region. However, the second diffusion film layer has a large diffusion inhibition effect on a second metal element in the second metal oxide layer, and the second metal element is not easy to diffuse into the dielectric layer corresponding to a second region, thereby resulting in poor performance of the semiconductor structure.

In order to improve the performance of the semiconductor structure, the embodiments of the disclosure provide a manufacturing method for a semiconductor structure, including: sequentially forming a dielectric layer and a first diffusion film layer on a substrate, the first diffusion film layer including a first metal oxide layer; then, retaining the first diffusion film layer corresponding to a first region of the substrate, and removing the first diffusion film layer corresponding to a second region of the substrate; and next, forming the second diffusion film layer on the dielectric layer corresponding to the second region of the substrate. A second metal oxide layer in the second diffusion film layer interfaces with the dielectric layer, so that a second metal element in the second metal oxide layer is easy to diffuse into the corresponding dielectric layer during the annealing treatment, thereby improving the performance of the semiconductor structure.

First Embodiment

Referring to FIG. 1 to FIG. 9, FIG. 1 is a flowchart of a manufacturing method for a semiconductor structure according to an embodiment of the disclosure, which is used for forming a semiconductor structure having good performance. FIG. 2 to FIG. 9 are schematic structural diagrams of a semiconductor structure at different phases. The manufacturing method for a semiconductor structure is described below in combination with FIG. 1 to FIG. 9. The manufacturing method for a semiconductor structure includes the following steps.

In S101, a substrate is provided, the substrate including a first region and a second region disposed outside the first region.

Figure 2:
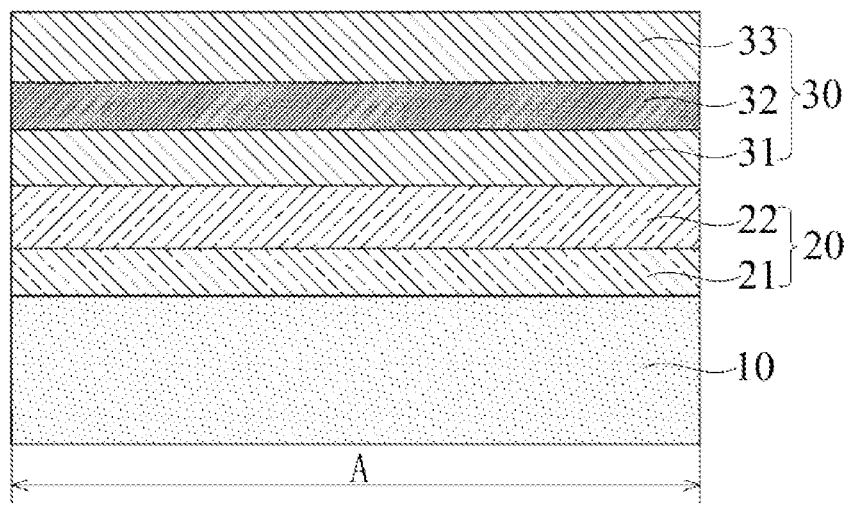
FIG. 2 is a schematic structural diagram of all film layers corresponding to a first region after a first diffusion film layer is formed according to an embodiment of the disclosure.
Figure 3:
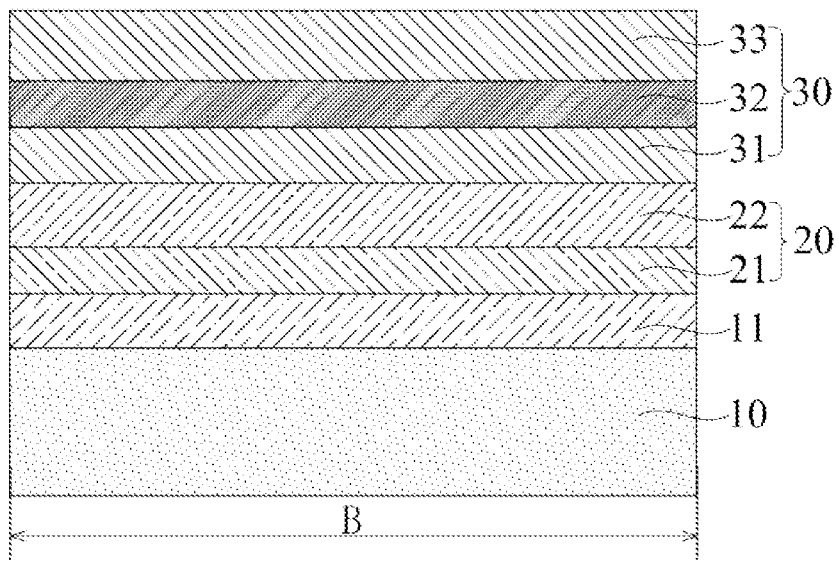
FIG. 3 is a schematic structural diagram of all film layers corresponding to a second region after a first diffusion film layer is formed according to an embodiment of the disclosure.

Referring to FIG. 2 and FIG. 3, the substrate 10 in this embodiment of the disclosure includes the first region and the second region disposed outside the first region. Exemplarily, a gap is formed between the first region and the second region, the first region is A shown in FIG. 2, and the second region is the B shown in FIG. 3.

A transistor or other component is formed on the first region and the second region of the substrate 10. Exemplarily, a Metal Oxide Semiconductor (MOS) transistor is formed in both the first region and the second region.

For convenience of description, in this embodiment of the disclosure and the following embodiments, description is made by taking forming an N-type transistor (NMOS) on the first region and forming a P-type transistor (PMOS) on the second region as an example.

The substrate 10 may be a semiconductor substrate. In this embodiment of the disclosure, the substrate 10 may be a silicon (Si) substrate. Of course, this embodiment of the disclosure is not limited thereto. The substrate 10 in this embodiment of the disclosure may also include a germanium (Ge) substrate, a Silicon on Insulator (SOI) substrate, a silicon germanium (SiGe) substrate, a silicon carbide (SiC) substrate, or a gallium nitride (GaN) substrate, etc.

It is to be noted that before performing the subsequent steps, the manufacturing method for a semiconductor structure in this embodiment of the disclosure further includes: forming an epitaxial layer 11 containing a preset metal on the substrate 10 corresponding to the second region.

Exemplarily, when the substrate 10 is a silicon substrate 10, the preset metal may be germanium, and a silicon germanium layer may be formed on a portion of the substrate 10 by epitaxial growth or the like. As shown in FIG. 3, the epitaxial layer 11 is disposed on the second region of the substrate 10.

It is to be noted that the material of the epitaxial layer 11 may be the same as that of the substrate or different from that of the substrate, and the preset metal may also be other metals. This embodiment of the disclosure is not limited thereto.

In S102, a dielectric layer is formed on the substrate.

Referring to FIG. 2 and FIG. 3, the dielectric layer 20 may be formed on the substrate 10 by a Chemical Vapor Deposition (CVD) process, a Physical Vapor Deposition (PVD) process, or an Atomic Layer Deposition (ALD) process.

As shown in FIG. 2 and FIG. 3, the dielectric layer 20 covers the first region and the second region of the substrate 10. In this embodiment of the disclosure, the dielectric layer 20 includes a first dielectric layer 22 and a second dielectric layer 21, and the second dielectric layer 21 is closer to the substrate 10 than the first dielectric layer 22.

The second dielectric layer 21 may be an oxide layer, for example, the material of the second dielectric layer 21 may include silicon oxide and silicon oxynitride; and the first dielectric layer 22 may have a high-k, for example, the material of the first dielectric layer 22 may include hafnium oxide, silicon-doped hafnium oxide, silicon-doped zirconium oxide, etc. In this embodiment of the disclosure, the dielectric constant of the first dielectric layer 22 is greater than the dielectric constant of the second dielectric layer 21.

It is to be noted that the second dielectric layer 21 corresponding to the second region may be doped with metal. Exemplarily, the second dielectric layer 21 may be made of germanium-doped silicon oxide, and the metal doped in the second dielectric layer 21 may be a preset metal or another metal.

In S103, a first diffusion film layer is formed on the dielectric layer, and the first diffusion film layer includes a first metal oxide layer.

With continued reference to FIG. 2 and FIG. 3, in this embodiment of the disclosure, the first diffusion film layer 30 may be formed on the dielectric layer 20 by a deposition process, and the first diffusion film layer 30 covers the dielectric layer 20 corresponding to the first region and the second region. The first diffusion film layer 30 includes the first metal oxide layer 32, so that a first metal element in the first metal oxide layer 32 diffuses into the dielectric layer 20 corresponding to the first region during subsequent processing. Exemplarily, the first metal oxide layer may be made of lanthanum oxide ($La_2O_3$).

In S104, the first diffusion film layer corresponding to the second region is removed.

Figure 4:
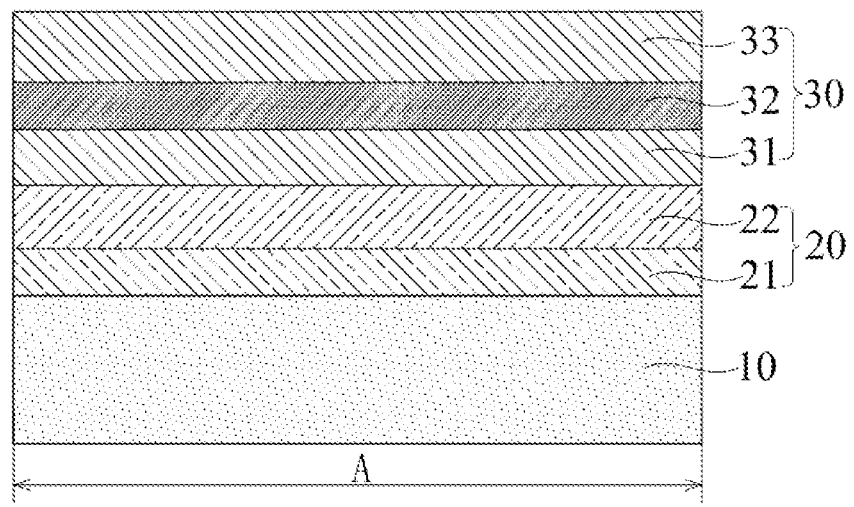
FIG. 4 is a structural schematic diagram of all film layers corresponding to a first region after a portion of a first diffusion film layer is removed according to an embodiment of the disclosure.
Figure 5:
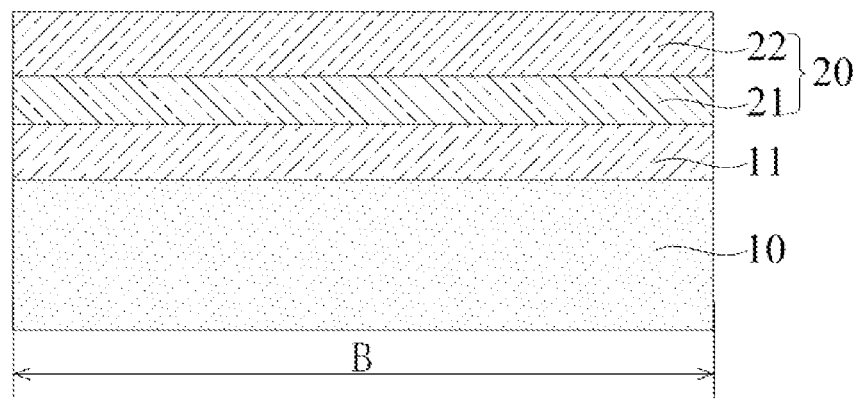
FIG. 5 is a schematic structural diagram of all film layers corresponding to a second region after a portion of a first diffusion film layer is removed according to an embodiment of the disclosure.

Referring to FIG. 4 and FIG. 5, the first diffusion film layer 30 may be removed by an etching process, such as dry etching or wet etching. In this step, a portion of the first diffusion film layer 30 is removed. As shown in FIG. 4 and FIG. 5, the first diffusion film layer 30 corresponding to the second region is removed, and the first diffusion film layer 30 corresponding to the first region is retained.

In S105, a second diffusion film layer is formed on the dielectric layer corresponding to the second region, and the second diffusion film layer includes a second metal oxide layer interfacing with the dielectric layer.

Figure 6:
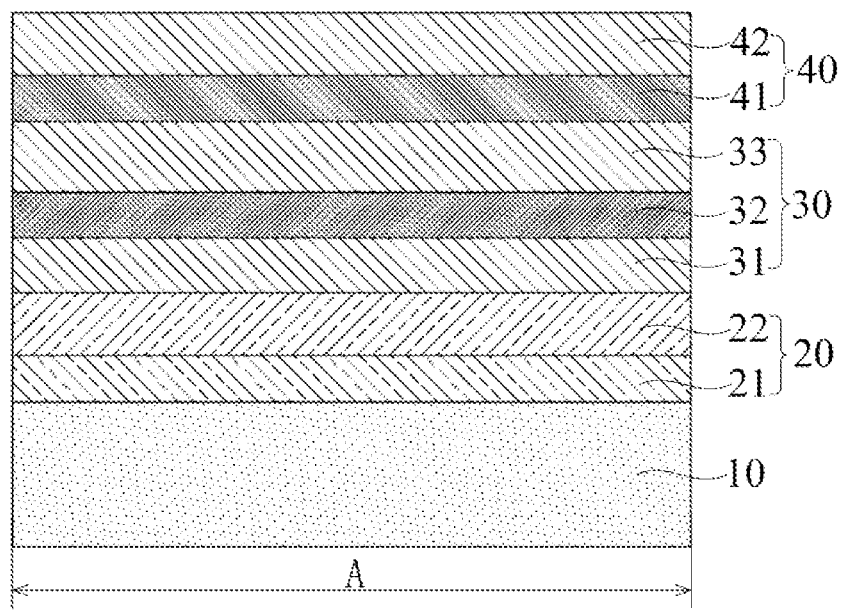
FIG. 6 is a schematic structural diagram of all film layers corresponding to a first region after a second diffusion film layer is formed according to an embodiment of the disclosure.
Figure 7:
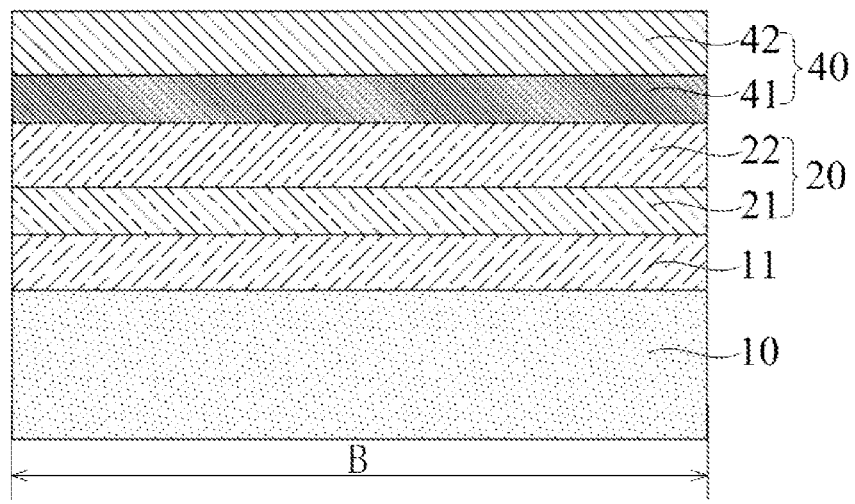
FIG. 7 is a schematic structural diagram of all film layers corresponding to a second region after a second diffusion film layer is formed according to an embodiment of the disclosure.

Referring to FIG. 6 and FIG. 7, the second diffusion film layer 40 may be formed on the dielectric layer 20 corresponding to the second region by a deposition process, and the second metal oxide layer 41 in the second diffusion film layer 40 interfaces with the dielectric layer 20. Exemplarily, the second metal oxide layer may be made of aluminum oxide ($Al_2O_3$).

In some possible examples, the step of forming a second diffusion film layer 40 on the dielectric layer 20 corresponding to the second region includes:

first, forming the second diffusion film layer 40 on the first diffusion film layer 30 corresponding to the first region and the dielectric layer 20 corresponding to the second region. As shown in FIG. 6 and FIG. 7, the second diffusion film layer 40 covers the first diffusion film layer 30 and the dielectric layer 20, i.e., the second diffusion film layer 40 is deposited simultaneously on the dielectric layer 20 corresponding to the first region and the second region.

It is to be noted that the second diffusion film layer 40 includes the second metal oxide layer 41. As shown in FIG. 6 and FIG. 7, the second metal oxide layer 41 interfaces with the first diffusion film layer 30 corresponding to the first region, and the dielectric layer 20 corresponding to the second region.

After the second diffusion film layer 40 is formed, as shown in FIG. 6, the dielectric layer 20, the first diffusion film layer 30, and the second diffusion film layer 40 are sequentially formed on the first region of the substrate 10 from bottom to top; and as shown in FIG. 7, the dielectric layer 20 and the second diffusion film layer 40 are sequentially formed on the second region of the substrate 10 from bottom to top.

Figure 8:
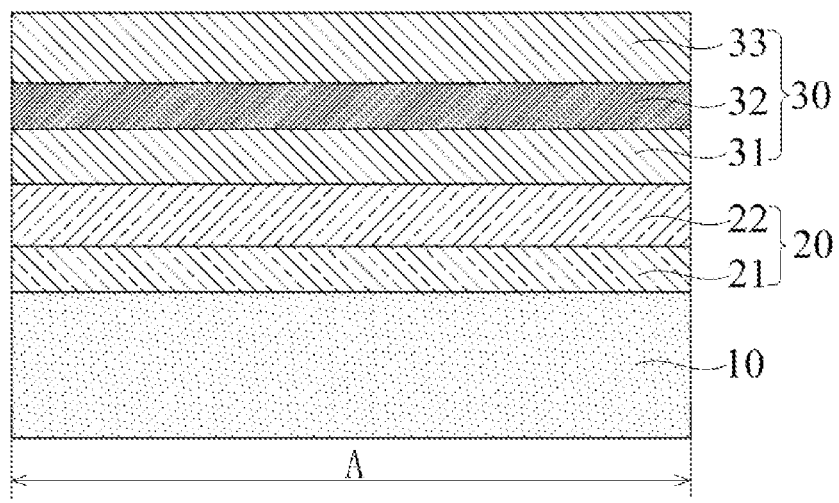
FIG. 8 is a structural schematic diagram of all film layers corresponding to a first region after a portion of a second diffusion film layer is removed according to an embodiment of the disclosure.
Figure 9:
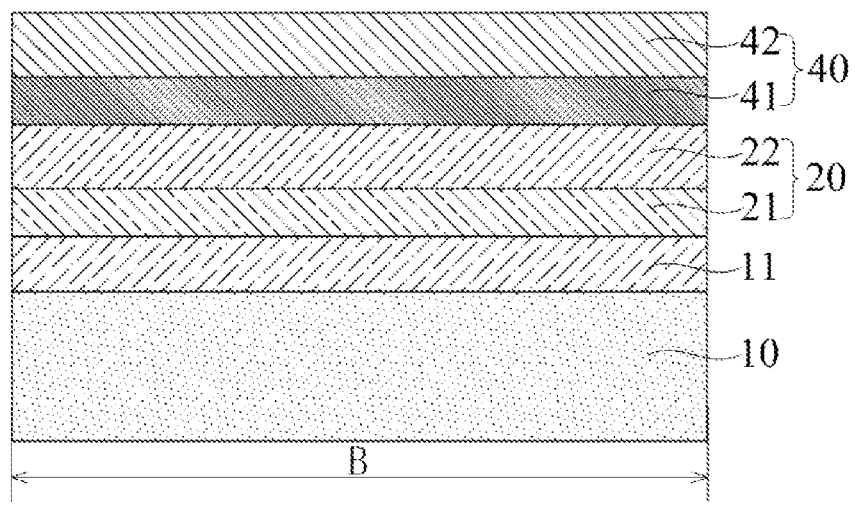
FIG. 9 is a schematic structural diagram of all film layers corresponding to a second region after a portion of a second diffusion film layer is removed according to an embodiment of the disclosure.

Then, the second diffusion film layer 40 corresponding to the first region is removed by etching. That is to say, the second diffusion film layer 40 corresponding to the second region is retained. Referring to FIG. 8 and FIG. 9, the first diffusion film layer 30 is formed on the dielectric layer 20 corresponding to the first region, and the second diffusion film layer 40 is formed on the dielectric layer 20 corresponding to the second region.

In S106, an annealing treatment is performed to diffuse a first metal element in the first metal oxide layer into the dielectric layer corresponding to the first region and diffuse a second metal element in the second metal oxide layer into the dielectric layer corresponding to the second region.

During annealing, since the second metal oxide layer 41 interfaces with the dielectric layer 20, i.e., as shown in FIG. 9, the second metal oxide layer 41 is in contact with the dielectric layer 20, and no other film layer is blocked between the second metal oxide layer 41 and the dielectric layer 20, the second metal in the second metal oxide layer 41 is easy to diffuse into the dielectric layer 20 corresponding to the second region, thereby improving the performance of the semiconductor structure.

The manufacturing method for a semiconductor structure provided in this embodiment of the disclosure includes: the substrate 10 is provided firstly, the substrate 10 including the first region and the second region disposed outside the first region; secondly, the dielectric layer 20 is formed on the substrate 10; thirdly, the first diffusion film layer 30 is formed on the dielectric layer 20, the first diffusion film layer 30 including the first metal oxide layer 32; fourthly, the first diffusion film layer 30 corresponding to the second region is removed; fifthly, the second diffusion film layer 40 is formed on the dielectric layer 20 corresponding to the second region, the second diffusion film layer 40 including the second metal oxide layer 41 interfacing with the dielectric layer 20; and sixthly, an annealing treatment is performed to diffuse the first metal element in the first metal oxide layer 32 into the dielectric layer 20 corresponding to the first region and diffuse the second metal element in the second metal oxide layer 41 into the dielectric layer 20 corresponding to the second region. Since the second metal oxide layer 41 interfaces with the dielectric layer 20, and no other film layer is blocked therebetween, the second metal in the second metal oxide layer 41 is easier to diffuse into the dielectric layer 20 corresponding to the second region, thereby improving the performance of the formed semiconductor structure.

It is to be noted that referring to FIG. 2 and FIG. 3, the first diffusion film layer 30 includes the first metal oxide layer 32 and a first sealing layer 33. The first sealing layer 33 is disposed on a side of the first metal oxide layer 32 facing away from the substrate 10. The first sealing layer 33 may protect the first metal oxide layer. Exemplarily, the first sealing layer 33 may be made of titanium nitride (TiN).

The step of forming a first diffusion film layer 30 includes: sequentially forming the first metal oxide layer 32 and the first sealing layer 33 on the dielectric layer 20. That is to say, the first metal oxide layer 32 is first formed on the dielectric layer 20, and then the first sealing layer 33 is formed on the first metal oxide layer 32.

Before forming the first metal oxide layer 32, the manufacturing method for a semiconductor structure in this embodiment of the disclosure further includes: forming a barrier layer 31 on the dielectric layer 20.

The barrier layer 31 may be used to prevent damage to the dielectric layer 20 when the first diffusion film layer 30 is subsequently removed. Exemplarily, when the first diffusion film layer 30 is removed by an etching process, the barrier layer 31 may serve as an etch stop layer, for example, the barrier layer 31 may be a titanium nitride layer.

It is to be noted that referring to FIG. 6 and FIG. 7, when the first diffusion film layer 30 includes the barrier layer 31, the first metal oxide layer 32, and the first sealing layer 33 which are sequentially stacked, the first sealing layer 33 is disposed on a side of the first metal oxide layer 32 facing away from the substrate 10. The step of forming a second diffusion film layer 40 on the first diffusion film layer 30 corresponding to the first region and the dielectric layer 20 corresponding to the second region includes:

sequentially forming the second metal oxide layer 41 and a second sealing layer 42 on the first diffusion film layer 30 corresponding to the first region and the dielectric layer 20 corresponding to the second region. As shown in FIG. 7 and FIG. 8, the second diffusion film layer 40 includes the second metal oxide layer 41 and the second sealing layer 42 disposed on the second metal oxide layer 41. The second sealing layer 42 may protect the second metal oxide layer 41, and the second sealing layer 42 may be made of titanium nitride.

Second Embodiment

This embodiment of the disclosure provides a semiconductor structure. Referring to FIG. 8 and FIG. 9, the semiconductor structure includes a substrate 10 and a dielectric layer 20 disposed on the substrate 10. The substrate 10 includes a first region and a second region disposed outside the first region. Exemplarily, a gap is formed between the first region and the second region, the first region is A shown in FIG. 8, and the second region is the B shown in FIG. 9.

The substrate 10 may be a semiconductor substrate. Exemplarily, the substrate 10 may be a silicon (Si) substrate. Of course, this embodiment of the disclosure is not limited thereto. The substrate in this embodiment of the disclosure may also be made of other materials.

In some possible examples, an epitaxial layer 11 is provided on the substrate 10 of the second region, the epitaxial layer 11 includes a preset metal, and the preset metal may be germanium. As shown in FIG. 9, the epitaxial layer 11 is formed on the substrate 10 corresponding to the second region, for example, a silicon germanium layer may be formed on the substrate 10 corresponding to the second region by epitaxial growth or the like.

It is to be noted that the material of the epitaxial layer 11 may be the same as that of the substrate or different from that of the substrate, and the preset metal may also be other metals. This embodiment of the disclosure is not limited thereto.

With continued reference to FIG. 8 and FIG. 9, the dielectric layer 20 covers the first region and the second region of the substrate 10. In this embodiment of the disclosure, the dielectric layer 20 includes a first dielectric layer 22 and a second dielectric layer 21 which are stacked, and the second dielectric layer 21 is closer to the substrate 10 than the first dielectric layer 22, i.e., the first dielectric layer 22 is disposed on a side of the second dielectric layer 21 facing away from the substrate 10.

The second dielectric layer 21 may be an oxide layer, for example, the material of the second dielectric layer 21 may include silicon oxide or silicon oxynitride; and the first dielectric layer 22 may have a high-k, for example, the material of the first dielectric layer 22 may include hafnium oxide, silicon-doped hafnium oxide, silicon-doped zirconium oxide, etc. The dielectric constant of the first dielectric layer 22 is greater than the dielectric constant of the second dielectric layer 21.

It is to be noted that the second dielectric layer 21 corresponding to the second region may be doped with metal. Exemplarily, the second dielectric layer 21 may be made of germanium-doped silicon oxide, and the metal doped in the second dielectric layer 21 may be a preset metal or other metals.

With continued reference to FIG. 8 and FIG. 9, the semiconductor structure further includes a first diffusion film layer 30 and a second diffusion film layer 40. As shown in FIG. 8, the first diffusion film layer 30 is formed on the dielectric layer 20 corresponding to the first region, and as shown in FIG. 9, the second diffusion film layer 40 is formed on the dielectric layer 20 corresponding to the second region.

The first diffusion film layer 30 includes a first metal oxide layer 32, and a first metal element in the layer may diffuse into the dielectric layer 20 corresponding to the first region during the annealing treatment. Exemplarily, the first metal oxide layer may be made of lanthanum oxide ($La_2O_3$).

In some possible examples, the first diffusion film layer 30 includes the first metal oxide layer 32 and a first sealing layer 33 which are stacked. The first sealing layer 33 is disposed on a side of the first metal oxide layer 32 facing away from the substrate 10. The first sealing layer 33 may protect the first metal oxide layer. Exemplarily, the first sealing layer 33 may be made of titanium nitride.

It is to be noted that the first diffusion film layer 30 further includes a barrier layer 31 disposed between the first metal oxide layer 32 and the dielectric layer 20, and the barrier layer 31 may protect the dielectric layer 20 to reduce or avoid damage to the dielectric layer 20. When the first metal oxide layer is made of lanthanum oxide, and the barrier layer 31 may be made of titanium nitride.

The second diffusion film layer 40 includes a second metal oxide layer 41. The second metal oxide layer 41 interfaces with the dielectric layer 20, i.e., the second metal oxide layer 41 is in contact with the dielectric layer 20, and no other film layer is blocked between the two layers, so that the second metal element in the second metal oxide layer 41 is easy to diffuse into the dielectric layer 20 corresponding to the second region during the annealing treatment.

In some possible examples, the second diffusion film layer 40 further includes a second sealing layer 42. The second sealing layer 42 is disposed on a side of the second metal oxide layer 41 facing away from the substrate 10. As shown in FIG. 9, the second sealing layer 42 is disposed above the second metal oxide layer 41. The second sealing layer 42 may protect the second metal oxide layer. Exemplarily, the second sealing layer 42 may be made of titanium nitride.

With continued reference to FIG. 8 and FIG. 9, in this embodiment of the disclosure, the film layers disposed above the substrate 10 and corresponding to the first region may form an N-type transistor, and the film layers disposed above the substrate 10 and corresponding to the second region may form a P-type transistor.

The semiconductor structure provided in this embodiment of the disclosure includes the substrate 10 and the dielectric layer 20 provided on the substrate 10; the substrate 10 includes the first region and the second region disposed outside the first region; and the second diffusion film layer 40 is provided on the dielectric layer 20 corresponding to the second region, and the second diffusion film layer 40 includes the second metal oxide layer 41 interfacing with the dielectric layer 20. Since the second metal oxide layer 41 interfaces with the dielectric layer 20, and no other film layer blocks the second metal element in the second metal oxide layer 41, the second metal element is easy to diffuse into the dielectric layer 20 corresponding to the second region, thereby improving the performance of the semiconductor structure.

The embodiments or implementations of the present description are described in a progressive manner, and each embodiment focuses on illustrating differences from one another. Mutual references may be made to the same or similar portions among these embodiments.

Persons of ordinary skill in the art should understand that, in the disclosure of the disclosure, terms of "longitudinal", "lateral", "upper", "front", "back", "left", "right", "perpendicular", "horizontal", "top", "bottom", "inner", "outer", etc. that indicate relations of directions or positions are based on the relations of directions or positions shown in the appended drawings, which are only to facilitate description of the disclosure and to simplify the description, rather than to indicate or imply that the referred system or element is limited to the specific direction or to be operated or configured in the specific direction. Therefore, the above-mentioned terms shall not be interpreted as limitation to the disclosure.

In the description of the present description, the description with reference to the terms "one embodiment", "some embodiments", "illustrative embodiment", "example", "specific example", or "some examples", or the like, means that specific features, structures, materials or characteristics described in conjunction with the embodiments or the examples are included in the at least one embodiment or example of the disclosure. In the present description, the illustrative expressions of the above terms do not necessarily refer to the same embodiment or example. Moreover, the described specific features, structures, materials or characteristics can be combined in a proper manner in any one of or more embodiments or examples.

It is to be explained at last that: the foregoing embodiments are merely intended for describing the technical solutions of the disclosure other than limiting the disclosure. Although the disclosure is described in detail with reference to the foregoing embodiments, persons of ordinary skill in the art should understand that they may still make modifications to the technical solutions described in the foregoing embodiments or make equivalent replacements to some or all technical features thereof, and such modifications or replacements do not depart the essence of the corresponding technical solutions from the scope of the technical solutions of the embodiments of the disclosure.

The invention claimed is:

1. A manufacturing method for a semiconductor structure, comprising:
providing a substrate, the substrate comprising a first region and a second region disposed outside the first region;
forming a dielectric layer on the substrate;
forming a first diffusion film layer on the dielectric layer, which comprises sequentially forming a barrier layer, a first metal oxide layer and a first sealing layer on the dielectric layer;
removing the first diffusion film layer corresponding to the second region;
forming a second diffusion film layer on the first diffusion film layer corresponding to the first region and the dielectric layer corresponding to the second region, which comprises sequentially forming a second metal oxide layer and a second sealing layer on the first diffusion film layer corresponding to the first region and directly on the dielectric layer corresponding to the second region;
removing the second diffusion film layer corresponding to the first region by etching; and
performing an annealing treatment to diffuse a first metal element in the first metal oxide layer into the dielectric layer corresponding to the first region and diffuse a second metal element in the second metal oxide layer into the dielectric layer corresponding to the second region;
wherein the first metal oxide layer is made of lanthanum oxide, the second metal oxide layer is made of aluminum oxide, the barrier layer as well as the first sealing layer and the second sealing layer are made of titanium nitride.

2. The manufacturing method for a semiconductor structure of claim 1, further comprising: before forming the dielectric layer,
forming an epitaxial layer containing a preset metal on the substrate corresponding to the second region.

3. The manufacturing method for a semiconductor structure of claim 2, wherein the substrate is a silicon substrate, and the preset metal is germanium.

4. A semiconductor structure, comprising:
a substrate, the substrate having a first region and a second region disposed outside the first region;
a dielectric layer provided on the substrate;
a first diffusion film layer provided on the dielectric layer corresponding to the first region, the first diffusion film layer comprising a barrier layer, a first metal oxide layer and a first sealing layer which are stacked, wherein the barrier layer is disposed between the first metal oxide layer and the dielectric layer, and the first sealing layer is disposed on a side of the first metal oxide layer facing away from the substrate; and
a second diffusion film layer is provided on the dielectric layer corresponding to the second region, the second diffusion film layer comprising a second metal oxide layer and a second sealing layer which are stacked, wherein the second metal oxide layer interfaces directly with the dielectric layer and the second sealing layer is disposed on a side of the second metal oxide layer facing away from the substrate; and,
wherein the first metal oxide layer is made of lanthanum oxide, the second metal oxide layer is made of aluminum oxide, the barrier layer as well as the first sealing layer and the second sealing layer are made of titanium nitride.

5. The semiconductor structure of claim 4, wherein an epitaxial layer containing a preset metal is provided on the substrate corresponding to the second region.

6. The semiconductor structure of claim 5, wherein the substrate is a silicon substrate, and the preset metal is germanium.

7. The semiconductor structure of claim 4, wherein the dielectric layer comprises a first dielectric layer and a second dielectric layer which are stacked, the first dielectric layer is disposed on a side of the second dielectric layer facing away from the substrate, and a dielectric constant of the first dielectric layer is greater than a dielectric constant of the second dielectric layer.

8. The semiconductor structure of claim 4, wherein the first diffusion film layers disposed on the substrate and corresponding to the first region forms an N-type transistor, and the second diffusion film layers disposed on the substrate and corresponding to the second region forms a P-type transistor.

* * * * *